US011520232B2

(12) United States Patent
Sasaki

(10) Patent No.: US 11,520,232 B2
(45) Date of Patent: Dec. 6, 2022

(54) FILM FOR APPLICATION TO THREE-DIMENSIONAL SAMPLE, METHOD FOR MANUFACTURING SAME, AND METHOD FOR TRANSFERRING FINE PATTERN USING SAME

(71) Applicant: Toyota School Foundation, Nagoya (JP)

(72) Inventor: Minoru Sasaki, Nagoya (JP)

(73) Assignee: Toyota School Foundation, Nagoya (JP)

( * ) Notice: Subject to any disclaimer, the term of this patent is extended or adjusted under 35 U.S.C. 154(b) by 833 days.

(21) Appl. No.: 15/877,973

(22) Filed: Jan. 23, 2018

(65) Prior Publication Data
US 2018/0210340 A1  Jul. 26, 2018

(51) Int. Cl.
| | | |
|---|---|---|
| *G03F 7/09* | (2006.01) |
| *G03F 7/20* | (2006.01) |
| *H01L 21/027* | (2006.01) |
| *H01L 23/544* | (2006.01) |
| *H01L 21/033* | (2006.01) |
| *G03F 7/00* | (2006.01) |

(52) U.S. Cl.
CPC ............... *G03F 7/09* (2013.01); *G03F 7/00* (2013.01); *G03F 7/0002* (2013.01); *G03F 7/0005* (2013.01); *G03F 7/0037* (2013.01); *G03F 7/2004* (2013.01); *G03F 7/2006* (2013.01); *H01L 21/027* (2013.01); *H01L 21/0272* (2013.01); *H01L 21/0274* (2013.01); *H01L 21/0335* (2013.01); *H01L 23/544* (2013.01); *H01L 2223/54426* (2013.01)

(58) Field of Classification Search
None
See application file for complete search history.

(56) References Cited

U.S. PATENT DOCUMENTS

| 2004/0234224 A1* | 11/2004 | Ishizaki | G02B 6/1221 |
| | | | 385/129 |
| 2007/0009206 A1* | 1/2007 | Sugiyama | B29C 33/3842 |
| | | | 385/33 |
| 2008/0213524 A1* | 9/2008 | Yao | B44F 1/00 |
| | | | 428/38 |

FOREIGN PATENT DOCUMENTS

| JP | H03119787 A | 5/1991 |
| JP | 2002303988 A | 10/2002 |
| JP | 2004063694 A | 2/2004 |
| JP | 2009194064 A | 8/2009 |
| JP | 2011104856 A | 6/2011 |

* cited by examiner

*Primary Examiner* — Kathleen Duda
(74) *Attorney, Agent, or Firm* — Nelson Mullins Riley & Scarborough LLP; Anthony A. Laurentano

(57) ABSTRACT

Provided is a film for application to a 3D sample, the film including a photoresist layer that has alignment or direction marks thereon. After the fine pattern of the photoresist layer or coat is exposed, the photoresist layer is applied to a desired position of the 3D sample by aligning the alignment or direction marks of the film with alignment or direction marks on the 3D sample. This allows for transfer of an appropriate fine pattern. Part or all of the thickness or area of the photoresist layer is developed to form projections or depressions in the photoresist layer before the film is applied to the 3D sample.

4 Claims, 5 Drawing Sheets

FILM FOR APPLICATION TO THREE-DIMENSIONAL SAMPLE, METHOD FOR MANUFACTURING SAME, AND METHOD FOR TRANSFERRING FINE PATTERN USING SAME

BACKGROUND OF THE INVENTION

Related Application

This application claims the benefit of Japanese patent application no. 2017-009461, filed on Jan. 23, 2017, which is incorporated by reference herein in its entirety.

Field of the Invention

The present invention relates to fine patterning technology that can apply photolithography, which is normally applicable only to flat surfaces, to three-dimensional (3D) samples.

Description of the Related Art

Electronic circuits, such as ICs and LSI circuits, have highly accurate and complicated structures integrated on a wafer. Such circuits are industrially fabricated by photolithography, which can create very fine structures by a series of operations for the entire wafer area at the same time while achieving high productivity. Generally, photolithography requires samples to be substantially planer. This shape limitation is attributable to the fact that use of a planar sample is a prerequisite or precondition for the spin coating of a photoresist layer and for the patterning of a resist layer or its optical image by irradiating a glass mask with UV light at a close range. In addition, processing machines for photolithography are designed for planar samples or designed on the precondition that the samples are planar.

Therefore, application of highly productive photolithography to 3D samples will only give poor results as the precondition that samples are planar are not satisfied. Attempts have been made to apply dry film resist. However, existing films of this type are generally intended for use with printed boards. The stress applied to the 3D sample during thermal lamination will be large enough to damage the sample and the resolution will remain low due to the thick resist film or coat. In addition, one patterning technique involves using a 3D laser drawing machine to scan a laser spot at which the resist layer is exposed. Although the smaller spot results in finer resolution, this point processing takes longer time to carry out drawing over the sample area than surface processing, in which the reaction occurs at many points at the same time. High resolution and high throughput are incompatible for the point processing. Currently, a wide variety of methods are used depending on the application.

The references cited below all disclose 3D processing techniques except for Japanese Published Unexamined Patent Application No. 2013-24913, which discloses films.

Japanese Published Unexamined Patent Application No. 2009-194064 discloses an apparatus for applying dry film resist to a 3D sample without breaking the sample. This apparatus comprises a table for applying a film and a separate table for holding a 3D sample. This apparatus is capable of handling a 3D structure by controlling the lifting and lowering of the latter table to maintain the position relationship of the location in which the film is applied. Although the apparatus is effective if the 3D sample has a consistent shape with respect to the widthwise direction of the film, it is not suitable for use with samples with irregular shapes in the widthwise direction having minute holes and grooves.

As the technology disclosed in this reference performs pattern transfer after the application of resist, it does not even contemplate performing alignment at the time of the application.

Japanese Published Unexamined Patent Application No. H11-260255 discloses a method of manufacturing a shadow mask for a color picture tube by using dry films having photoresist.

Each dry film is designed as a triple-layered structure with a cushion layer interposed between a base film and the photoresist. Polyvinyl alcohol (PVA) and its modification(s) are listed as the material for the cushion layer. This reference explains how the resist film or coating, made thinner due to the cushion layer (the thinnest film thickness mentioned is 10 µm), can conform to the projections or depressions of the sample surfaces as a pair of these films are pinched by two rollers and thermally laminated on both sides of the sample. The shadow mask on which the foregoing process is performed is a thin plate that can be considered planar.

As the disclosed technology performs pattern transfer after the application of resist, it does not even contemplate performing alignment at the time of the application.

Japanese Published Unexamined Patent Application No. H09-319068 discloses a photomask for forming an electrical circuit pattern on a 3D molded component.

3D masks are obtained by applying opaque coating to the surfaces of shaped articles made by stereo lithography. These 3D masks are joined to a planar film mask to provide a photomask with pattern openings that is three dimensionally shaped to come into close contact with matching surfaces. This photomask is brought into close contact with a 3D molded component previously coated with resist and then exposure and development are performed to obtain a 3D electrical circuit component with fine 3D circuit pattern formed thereon. As the foregoing 3D masks are effective to a plurality of surfaces of the 3D sample, the number of photomasks may be one or at least fewer than the number of the exposed surfaces.

As this is a stencil mask in terms of its basic operating principle, it is difficult to bring the resist and the photomask close enough to a level of the wavelength for exposure, which makes the resolution lower.

Japanese Published Unexamined Patent Application No. 2011-211064 discloses a method for transferring a pattern to the inside of a groove including the vertical wall surfaces of a 3D sample.

According to the reference, a resist film is formed by spray coating. This reference also discloses a method for allowing immersion exposure liquid to act as an optical attenuator as the innermost portions of the 3D sample are more thinly coated with resist such that the dose can be decreased to an appropriate exposure value in these inside portions. The attenuation factor can be adjusted by controlling the concentration of the optical attenuator agent. In this way, the intensities of the light reaching the upper and lower portions of the resist coat of the sample can be adjusted to appropriate values for the upper and lower portions. In view of the fact that a pattern is transferred to the wall surfaces by oblique exposure, abnormal patterning can be reduced as the intensity of reflected light can also be attenuated.

Japanese Published Unexamined Patent Application No. 2013-24913 is directed to a printed wiring board contained in electrical components used, for example, in personal computers and mobile phones.

This reference describes a multiplayer film that reduces the notches at the pattern profile that may causes problems if high-density wiring is formed using existing dry film resist. In particular, a laminated element is disclosed comprising a support film, an intermediate layer, and a photosensitive resin or photoresist laminated on top of each other. Additionally, the support film is a biaxially oriented polyester film having a particle-containing resin layer disposed on the side opposite to the intermediate layer to protect the photoresist from the effect of diffusion of light, and the intermediate layer is a water soluble resin layer.

A non-patent document "3-D WIRING ACROSS VERTICAL SIDEWALLS OF SI PHOTO CELLS FOR SERIES CONNECTION AND HIGH VOLTAGE GENERATION," S. Kumagai, T. Yamamoto, H. Kubo, M. Sasaki, The 25th International Conference on Micro Electro Mechanical Systems (2012.1.31, Paris, France), pp. 60-63" discloses a device fabricated by the method of transferring a pattern disclosed in Japanese Published Unexamined Patent Application No. 2011-211064, which is cited and discussed above. According to this reference, numerous solar cells including a p-n junction are provided on a rectangular island of crystal silicon formed on a silicon oxide film. Even the voltage produced by each individual solar cell may be low, a multiplicity of (e.g., 25, 50, or 100) serially connected solar cells are formed by patterning a film that is vapor-deposited onto the rectangular island including the wall surfaces. The voltage of each cell is added to increase the overall output voltage. In this implementation, the pattern width ranges from 20 µm to 70 µm.

Additional non-patent documents, a "3D Implemented Device MIPTEC" brochure by Panasonic Corporation and "'High-Speed Laser Processing System for Molded Interconnect Devices,' Panasonic Electric Works Technical Report, Takashi Shindou and Hiroshi Takahashi" describe a 3D circuit board (Molded Interconnect Device or MID) for forming an electrical circuit on the surface of an injection-molded article. This is a plastic injection-molded article provided with both mechanical and electrical functions.

The method for its manufacture comprises the steps of (1) providing a part having an array of 3D elements, (2) sputter-depositing a metallic thin film on all surfaces, (3) removing the metallic thin films along the outlines of the circuit pattern by laser drawing, (4) performing plating, and (5) cutting the parts off the array.

It is essential to reduce the size of a processing point if high-density interconnection wiring is aimed to be produced. However, if the laser spot is small, the amount of processing per point is reduced to take a longer time to cover the same area (the area increases with the square of the length). This inevitably reduces the productivity. It is possible to increase the productivity, for example, by splitting a laser beam into a plurality of beams for processing at multiple points by a plurality of galvano scanners and a rotary table. Although this does reduce the time required to change the orientation of the substrate, it still cannot overcome the inherent limitation of point processing. The Panasonic's brochure (Panasonic's 3D Implemented Device MID Solution) as of April 2016 describes a minimum pattern width of 50 µm and a minimum space distance of 50 µm.

SUMMARY OF THE INVENTION

Problem to Be Solved by the Invention

Conventionally, there have been many attempts to apply photolithography-based microfabrication technique not only to planer samples but also to 3D samples, including structures with projections or depressions having different heights in order to upgrade or sophisticate MEMS devices, such as sensors having a three-dimensional structure formed on a substrate, actuators (i.e., fragile structures supported by a suspension system from the substrate), and microfluidic devices based on the trench channels.

Micromachining of 3D structures is also required for optical devices on which elements need to be aligned along the light path and their implementations; 3D LSI circuits, which are implemented by stacking a plurality of conventional planer LSI devices and image sensors; and the functional surface texturing of precision machine elements having local flat and/or curved surfaces, which cannot be handled in the same manner as flat wafers.

However, no method has been developed to transfer a desired pattern to a 3D sample with a high degree of freedom without sacrificing the advantage inherent in photolithography that the high throughput/productivity can be obtained from processing many points at the same time. In addition, it is difficult to use existing processing machines, such as those for uniform resist film formation and exposure, designed for planer lithography for the purpose of the present invention.

Means to Solve the Problem

The present invention provides a film for application to a 3D sample, the film comprising a photoresist layer that has alignment or direction marks or references for aligning the position or direction of the film with the 3D sample. By using this film, the photoresist layer can be applied in an appropriate position with respect to the 3D sample or workpiece so that a desired fine pattern can be transferred to the 3D sample.

Additionally, in one aspect of the present invention, which provides a film for application to a 3D sample, the film comprising a photoresist layer that has alignment or direction marks or references for aligning the position or direction of the film with the 3D sample, before the film is applied to the 3D sample or workpiece, a fine pattern of the film is exposed using the alignment or direction marks or references to align the position or direction of the fine pattern. In this way, the fine pattern can be transferred to a desired position on the 3D sample.

In another aspect of the present invention, which provides a film for application to a 3D sample, the film comprising a photoresist layer that has alignment or direction marks or references for aligning the position or direction of the film with the 3D sample, part or all of an area of the photoresist layer is developed to form projections or depressions in the photoresist layer before the film is applied to the 3D sample or workpiece. In this way, the alignment or direction marks or references transferred simultaneously with the exposure of a fine pattern are manifested so that the fine pattern can be transferred to a desired position on the 3D sample.

In still another aspect of the present invention, which provides a film for application to a 3D sample, the film comprising a photoresist layer that has alignment or direction marks or references for aligning the position or direction of the film with the 3D sample, part or all of the thickness of the photoresist layer is developed to form projections or depressions in the photoresist layer before the film is applied to the 3D sample or workpiece. In this way, the alignment or direction marks or references transferred simultaneously with the exposure of a fine pattern are manifested so that the fine pattern can be transferred to a desired position on the 3D sample.

In still another aspect of the present invention, which provides a film for application to a 3D sample, the film comprising a photoresist layer that has alignment or direction marks or references for aligning the position or direction of the film with the 3D sample, fine shapes with a pattern width of 2 μm or less can be transferred, upon exposure of the fine pattern, by bringing a photomask and the photoresist layer into close contact with each other. This allows for the transfer of the fine pattern to a desired position on the 3D sample.

In yet another aspect of the present invention, which provides a film for application to a 3D sample, the film comprising a photoresist layer that has alignment or direction marks or references for aligning the position or direction of the film with the 3D sample, one of a light-emitting diode and a laser diode having an emission wavelength shorter than that of i-line of a mercury lamp (365 nm in wavelength) is used to transfer the fine pattern. In this way, the fine pattern can be clearly transferred onto a desired position of the 3D sample without degrading the resolution due to the optical diffraction.

Moreover, according to the present invention, substances, such as air, in gaps between the film, which includes the photoresist layer, and the 3D sample or workpiece can be removed to bring the film and the 3D sample into close contact with each other. In this way, the photoresist layer is securely mounted on the surface of the 3D sample so as not to be displaced by the developer, allowing the fine pattern to be transferred to a desired position on the 3D sample. Typical methods for removing the substances, such as air, from the gaps, include placing the film and the 3D sample in a deformable bag or container and evacuating that bag or container.

In a further aspect of the present invention, a film having a photoresist layer for application to a 3D sample is heated at a temperature not higher than the glass-transition temperature of the photoresist layer. This facilitates the deformation and the close contact of the film with the 3D sample so that the film can be applied to the 3D sample while reducing the degradation of the fine pattern transferred by exposure. Accordingly, the fine pattern can be transferred to a desired position on the 3D sample.

Effect of the Invention

The present invention provides alignment marks and a photoresist layer so as to allows preparing a uniform film thickness and facilitate the transfer of a fine pattern. Additionally, matching structures for alignment with alignment marks are provided on a 3D sample so that the fine pattern can be transferred to a desired position on the 3D sample.

At the time of the exposure involving pattern transfer, the photoresist and the mask are both planar, which can advantageously minimize the gap between them to provide high resolution. A fine pattern with a width of 2 μm or less can be transferred to the photoresist layer, and by performing development after application of the photoresist layer, an excellent pattern can be transferred without degrading the resolution due to the optical diffraction.

The projections or depressions formed on the photoresist layer prior to the application of the film provide passages through which air can be vented and also effectively eliminate air bubbles that would otherwise prevent close contact between the photoresist and the 3D sample during the application of the film.

BRIEF DESCRIPTION OF THE DRAWINGS

For a fuller understanding of the nature and objects of the present invention, reference should be made to the following detailed description and the accompanying drawings, in which.

DETAILED DESCRIPTION OF PREFERRED EMBODIMENTS

Preferred embodiments of the present invention will be described hereinafter with specific reference to the attached drawings. The drawings are provided for the purpose of illustration only and the shapes, materials, and the sizes of the films and the 3D samples or items to be processed ("workpieces") described therein are not limited to those depicted in the figures. In the following description, while examples of positive photoresist layers are illustrated, negative photoresist layers may also be used. In embodiments where a chemical amplification type photoresist is used, thermal processing may be additionally performed after exposure.

Embodiment 1

The first embodiment of the present invention relates to a film 1 for application to a three-dimensional (3D) sample, the film 1 comprising a photoresist layer that has alignment or direction marks or references ("film references" hereinafter) 1A.

The first embodiment additionally relates to a film on which a fine pattern is exposed before the film is affixed or applied to a 3D sample or workpiece.

Figure 1:
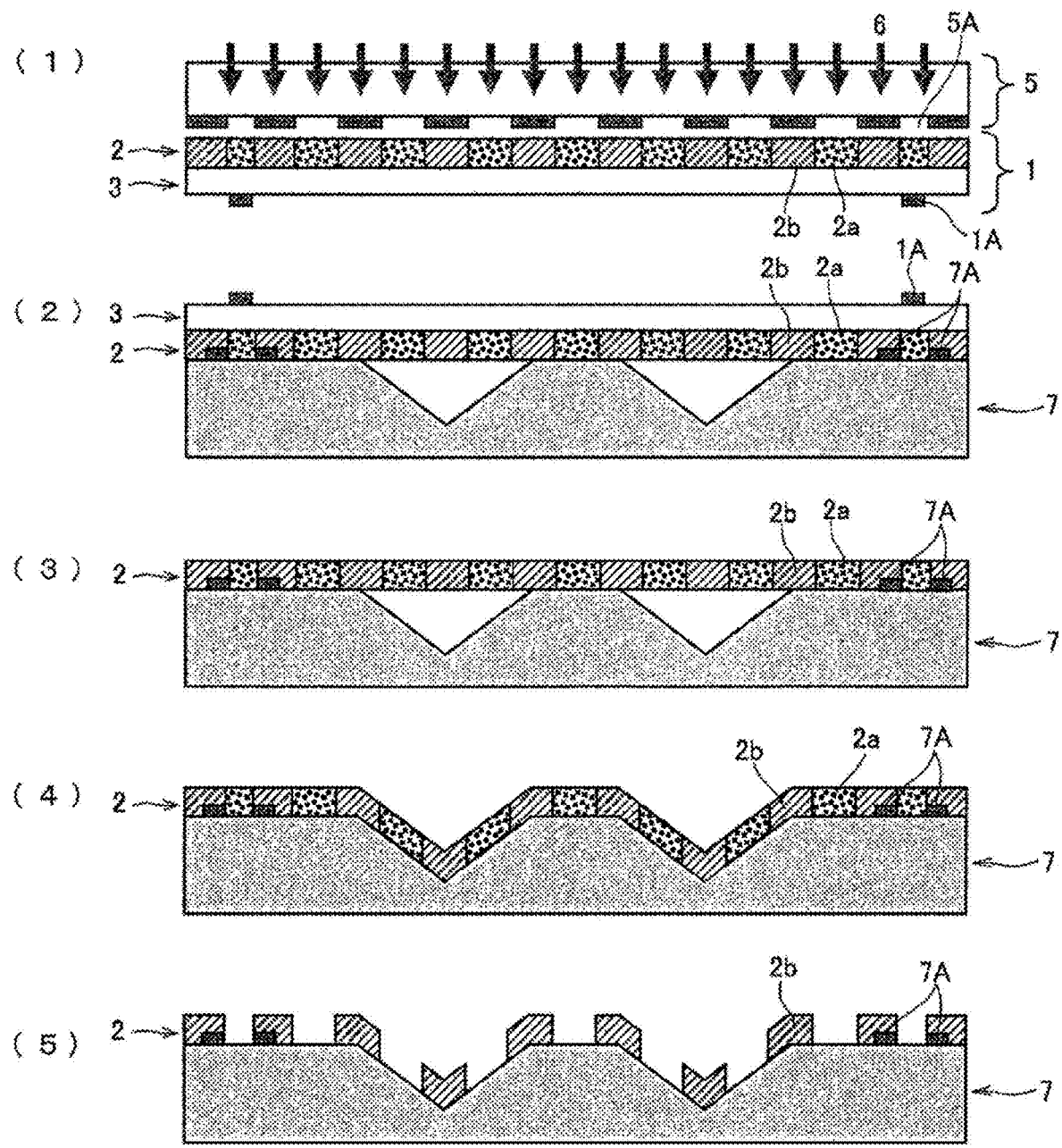
FIG. 1 is a process chart for applying a film to a 3D sample according to a first embodiment of the present invention.

FIG. 1 illustrates a film 1 for application to a 3D sample having a photoresist layer 2 and a process of its application.

The film 1 includes the photoresist layer 2, a support layer 3, and film references 1A. The film references 1A are disposed on the side of the film 1 that is not in contact with the photoresist layer 2. In other word, as shown in FIG. 1(1), the film 1 has the structure of the photoresist layer 2, the support layer 3, and the film references 1A in that order.

In Step (1), a fine pattern is exposed. This creates both areas 2a where the photoresist is to be removed by the subsequent development and areas 2b where the photoresist is to remain after the development. In some applications, the width of the fine pattern may be 2 micrometers (μm) or less. A light-emitting diode or a laser diode having an emission wavelength shorter than that of i-line of a mercury lamp (365 nm in wavelength) is used to achieve high resolution in the exposure process. The film references 1A and the alignment marks 5A on a photomask 5 (referred to as "mask references" hereinafter) are used to align the film 1 with the fine pattern.

In Step (2), the film 1 is applied to the 3D sample 7. To align the 3D sample 7 with the film 1, alignment marks ("sample references" hereinafter) 7A are prepared on the 3D sample 7 in advance. The photoresist layer 2 and the fine pattern transferred into it are placed in the desired position by aligning these marks.

In Step (3), the support layer 3 is removed. If the support layer 3 is a multilayer film, a combination of different methods or processes are used to remove the layers of different materials in the film in a step-by-step manner.

In Step (4), the photoresist layer 2 is brought into the grooves in the 3D sample.

In Step (5), the photoresist layer 2 is developed to transfer the fine pattern onto the desired position of the 3D sample 7.

It should be noted that the film references 1A may alternatively be embedded in the film 1. This will not require any change in Steps (1)-(5).

Embodiment 2

The second embodiment of the present invention differs from the first embodiment in that part 3a of the support layer 3 remains on the 3D sample in Step (2) to subsequently conform to the shape of the sample. A more detailed description is provided below with reference to FIG. 2.

Figure 2:
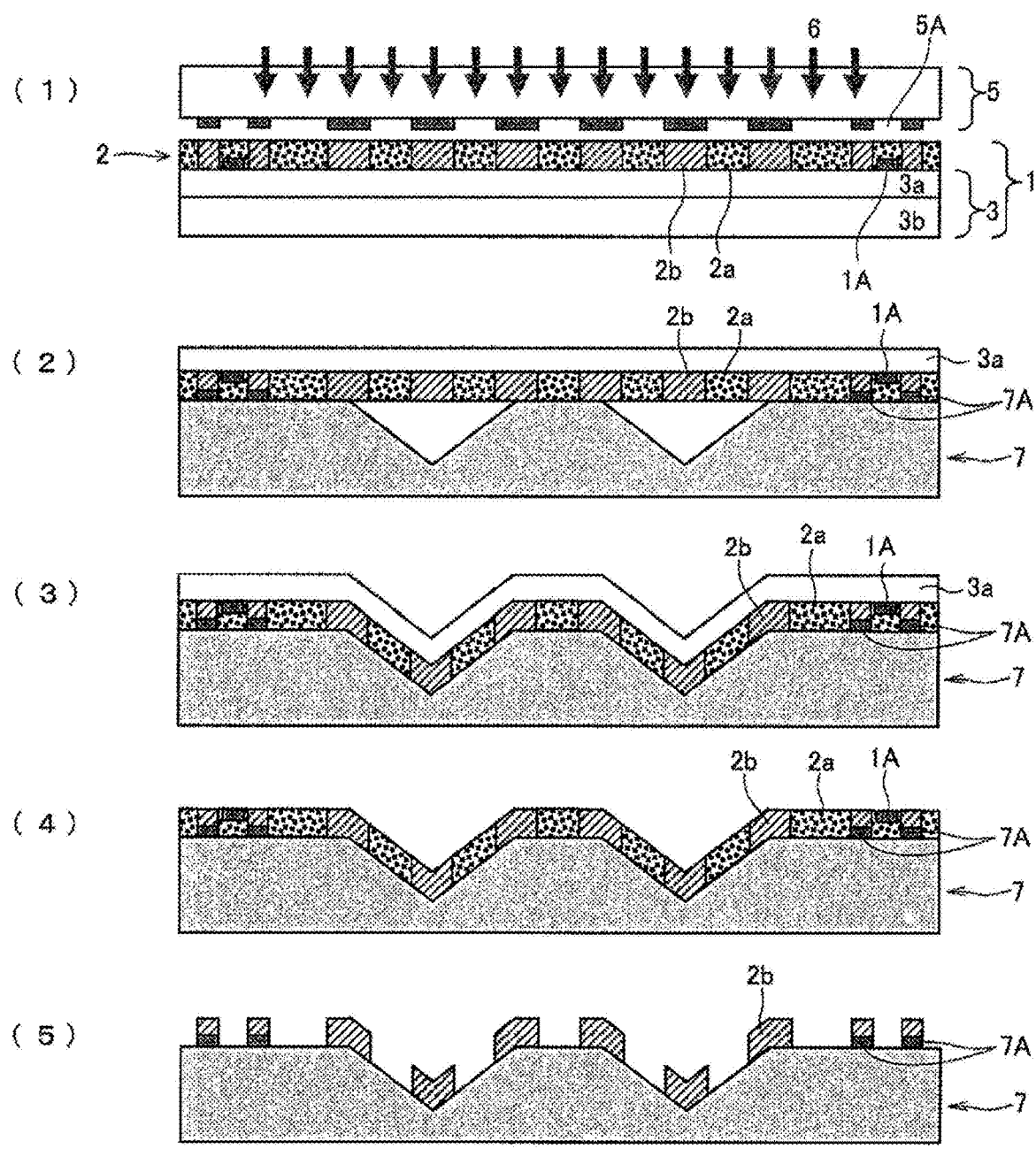
FIG. 2 is a process chart for applying a film to a 3D sample according to a second embodiment of the present invention.

As shown FIG. 2(1), in Step (1), film references 1A are provided on the side of the support layer 3 of a film 1 that is in contact with the photoresist layer 2. In other words, the film references 1A are in contact with the photoresist layer 2 on the support layers 3 (3a and 3b).

Although the photoresist layer 2 is susceptible to variation in the film thickness around the film references 1A, the microscope image can more easily be focused during observation to achieve alignment.

Although Step (1) of this embodiment is similar to Step (1) of the first embodiment, the support layer 3b is removed when the process advances to Step (2), and in Step (3), the support layer 3a is deformed together with the photoresist layer 2 and fitted into the V-shape grooves. If polyvinyl alcohol (PVA) and its modification product(s) are used for the support layer 3a, this layer can be removed as shown in Step (4) by immersing it in water as this material is water-soluble. This step does not affect the photoresist layer 2. Subsequently, in Step (5), the photoresist layer 2 is developed.

It should be noted that if the support layer 3a is a PVA layer, Step (4) may be omitted as PVA can be dissolved in the aqueous developer of Step (5). That is, in this case, Steps (4) and (5) can be carried out simultaneously.

Embodiment 3

Figure 3:
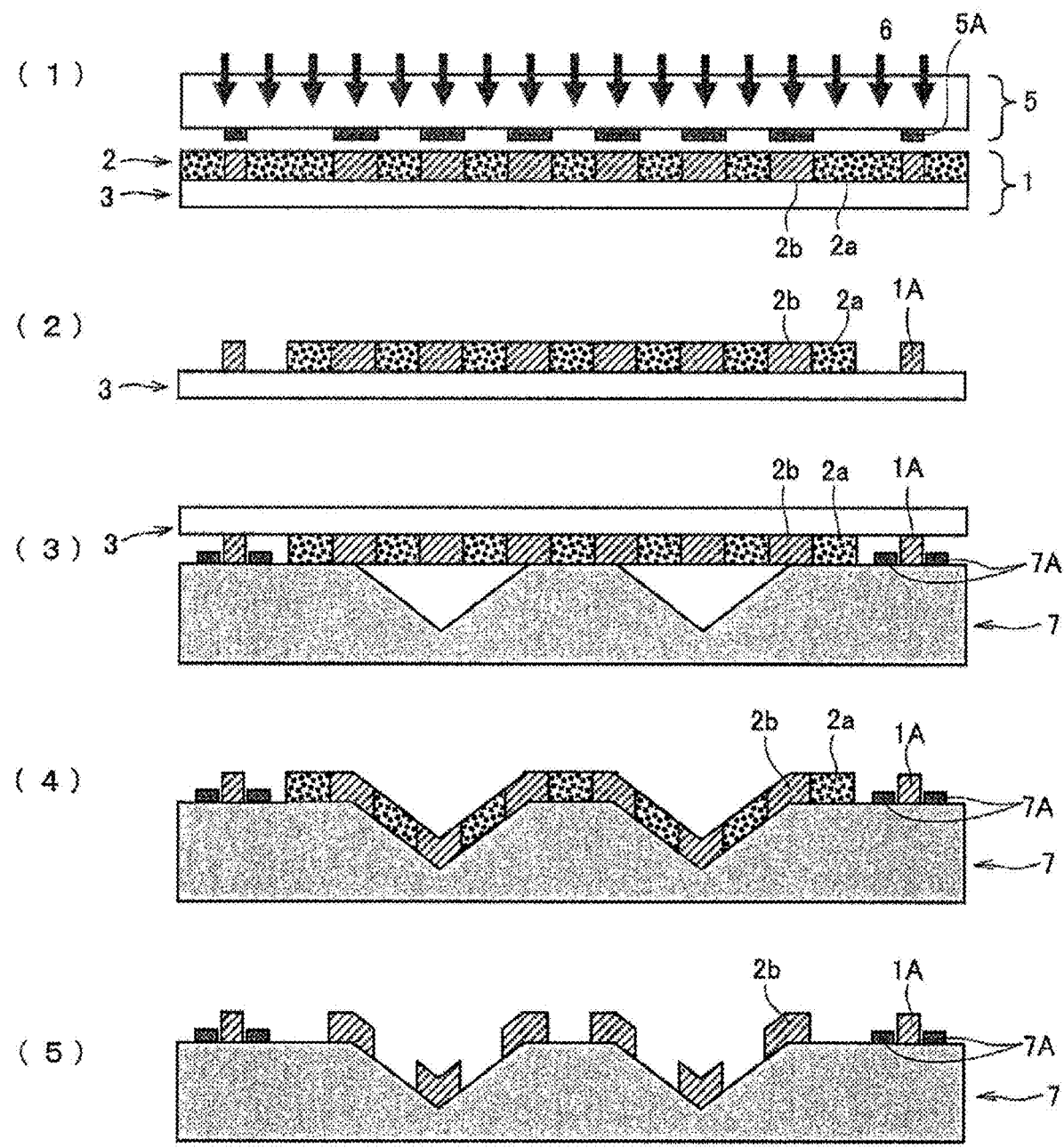
FIG. 3 is a process chart for applying a film to a 3D sample according to a third embodiment of the present invention.

In the third embodiment of the present invention, unlike in Step (1) of the first embodiment, no film references 1A are provided in advance on the film 1 for application to a 3D sample. Rather, they are formed simultaneously with the transfer of a fine pattern in this embodiment. A more detailed description is provided below with reference to FIG. 3.

In Step (1), the film references 1A are transferred from the photomask together with the exposure of the fine pattern. In Step (2), part of the area of the photoresist layer 2 of the film 1 is developed to manifest the film references. Although partial development of an area is a special process, it has the advantage of providing the film references 1A at the accuracy of the photomask. Furthermore, as the alignment procedure can be omitted when transferring the fine pattern, this can minimize the risk of causing abrasion between the film 1 and the photomask 5 and mutual damage due to their relative movement. Step (3) and the subsequent steps are identical with those of the first and second embodiments illustrated in FIGS. 1 and 2, respectively.

Embodiment 4

Figure 4:
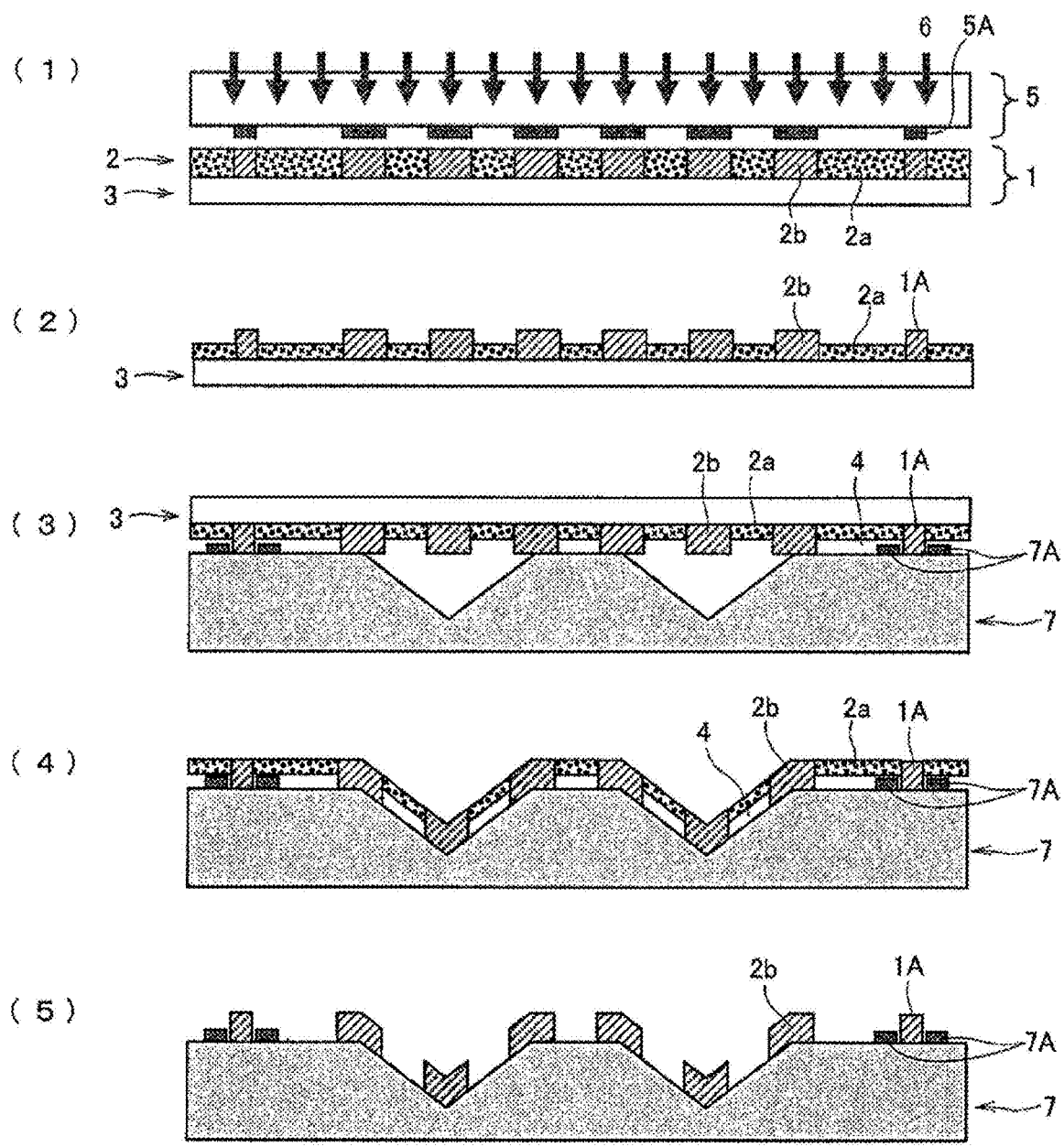
FIG. 4 is a process chart for applying a film to a 3D sample according to a fourth embodiment of the present invention.

In the fourth embodiment of the present invention, unlike in Step (1) of the first embodiment, no film references 1A are provided in advance on the film 1 for application to a 3D sample. Rather, they are formed simultaneously with the transfer of a fine pattern in this alternate embodiment. A more detailed description is provided below with reference to FIG. 4.

In Step (1), the film references 1A are transferred from the photomask together with the exposure of the fine pattern. In Step (2), the photoresist layer 2 of the film 1 is partially developed in the thickness direction to manifest the film references. Although partial development of the resist layer in the thickness direction is a special process, it has the advantage of providing the film references 1A at the accuracy of the photomask while confirming the pattern across the entire surface. Furthermore, as the alignment procedure can be omitted when transferring the fine pattern, this can minimize the risk of causing abrasion between the film 1 and the photomask 5 and mutual damage due to their relative movement. Methods for suppressing or stopping the development of the photoresist layer in the thickness direction halfway include diluting the developer and shortening the developing time. Step (3) and the subsequent steps are identical with those of the first and second embodiments illustrated in FIGS. 1 and 2, respectively.

During the application procedure in Steps (3) and (4), as the areas 2a of the photoresist layer 2 where the layer is eventually removed by development have been reduced so as to provide gaps 4. As air can be vented (i.e., evacuated or removed) through these gaps, air bubbles are not trapped, facilitating close or intimate contact of the photoresist layer 2 with the 3D sample 7. As there is less of the photoresist that has to be removed in the final development, it is easier to develop photoresist with a higher aspect ratio using a thicker photoresist layer.

EXAMPLE

One example of the present invention will be described hereinafter with reference to FIG. 5. The 3D sample in this example was made from a silicon (Si) substrate. V grooves were formed by thermal reflow of a polyimide film having a bottom width of 13 μm and an approximate height of 6.2 μm. The sidewall angle at around the bottom was about 50 degrees. A film/sheet 1 was prepared by spin coating a 1 μm-thick photoresist layer 2 on a support layer 3, which comprises a PVA layer 3a and a PET layer 3b, (using the SO Sheet available from AICELLO Corporation). The film/sheet 1 and the photomask 5 were brought into close contact with each other to carry out exposure with UV light so as to generate a latent image inside the photoresist layer. In this step, the film references 1A on the film/sheet 1 and the mask references 5A on the photomask 5 were used to align the direction of the film/sheet 1 with that of the V grooves in the 3D sample 7.

The film/sheet 1A was applied to the 3D sample 7 with the film references 1A on the prepared film/sheet 1 aligned with the sample references 7A on the 3D sample 7 so that the obtained line-and-space fine pattern was along the transverse direction or ran across the V grooves.

FIG. 2 depicts the fabrication process of the example. When applying the resist layer to the 3D sample 7, the supporting PET layer 3a was manually peeled off from the film/sheet 1. The PVA layer 3a, which remained on the 3D sample, was dissolved and removed by immersing it in water. Finally, the photoresist layer 2 was developed in the developer.

Figure 5:
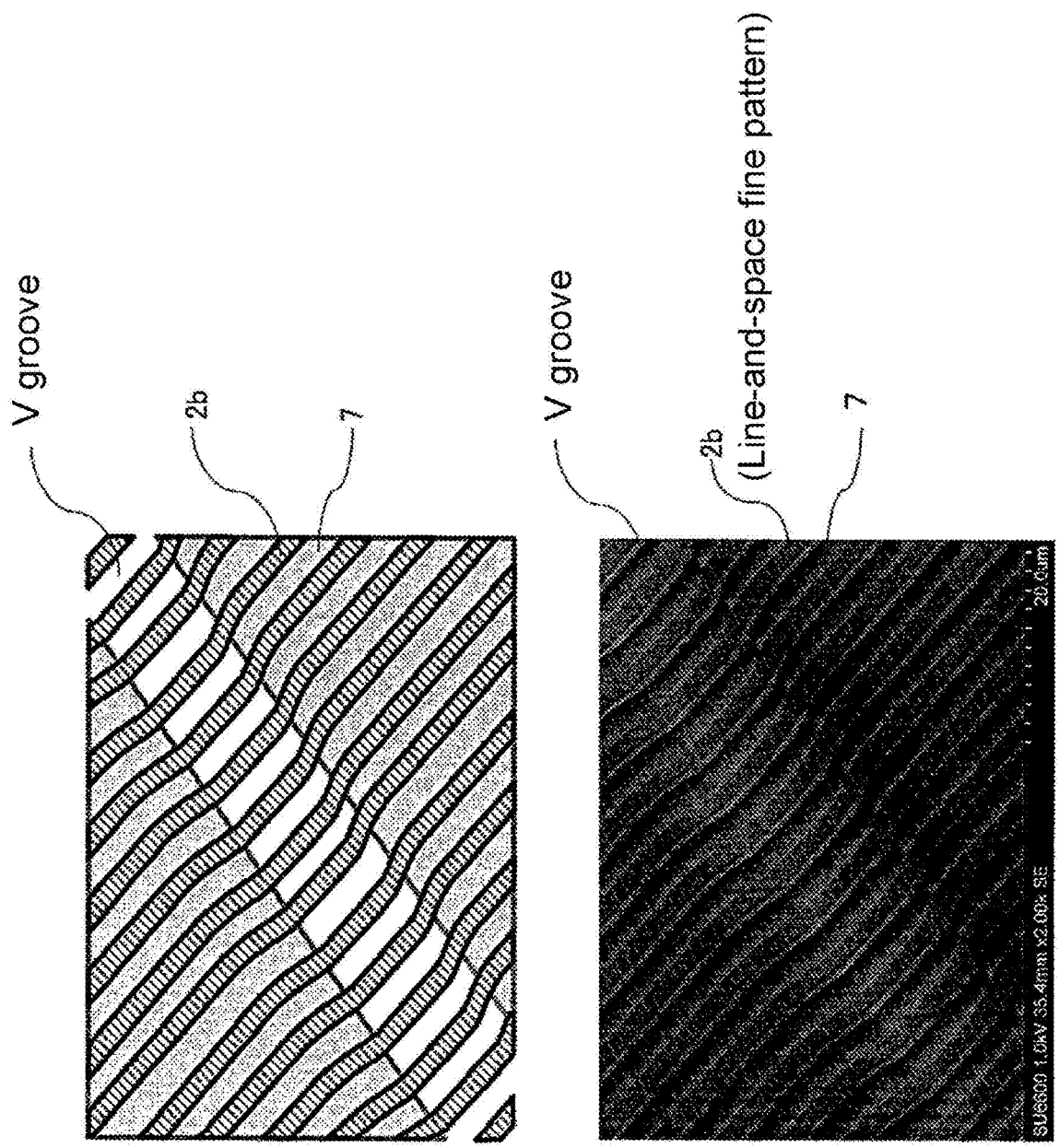
FIG. 5 illustrates a line-and-space pattern of an example of the present invention.

FIG. 5 shows the line-and-space fine pattern formed by the above-described processes. The pattern width is 2 μm and the pitch is 4 μm in the mask design. The resist pattern across the V grooves closely followed the groove contour, reaching their bottom portions.

INDUSTRIAL APPLICABILITY

There is a need for photolithography-based micromachining of 3D samples in a wide variety of applications that require 3D structures for achieving their functions, including, for example: MEMS devices, such as sensors, actuators (e.g., patterning of fragile microactuators released from substrates), and microfluidic devices based on the trench channels; optical devices or systems on which elements need to be aligned along the light path; 3D LSI circuits, which are implemented by stacking a plurality of conventional planer LSI devices and image sensors; and the functional surface texturing of precision machine elements having local flat and/or curved surfaces, which cannot be handled in the same manner as flat wafers.

What is claimed is:

1. A film for application to a 3D sample, the film comprising a photoresist layer that has alignment or direction marks or references for aligning the position or direction of the film with the 3D sample, wherein a latent image is generated in the photoresist layer by completing an exposure of a fine pattern before the film is applied to the 3D sample.

2. The film of claim 1, wherein part or all of an area of the photoresist layer is developed to form projections or depressions in the photoresist layer before the film is applied to the 3D sample.

3. The film of claim 1, wherein the photoresist layer is partially or fully developed in a thickness direction to form projections or depressions in the photoresist layer before the film is applied to the 3D sample.

4. The film of claim 1, wherein a width of the fine pattern is 2 μm or less.

* * * * *